United States Patent
Cottrell et al.

(10) Patent No.: US 6,995,376 B2
(45) Date of Patent: Feb. 7, 2006

(54) SILICON-ON-INSULATOR LATCH-UP PULSE-RADIATION DETECTOR

(75) Inventors: Peter E. Cottrell, Essex Junction, VT (US); Robert H. Dennard, New Rochelle, NY (US); Edward J. Nowak, Essex Junction, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 10/604,204

(22) Filed: Jul. 1, 2003

(65) Prior Publication Data

US 2005/0001171 A1    Jan. 6, 2005

(51) Int. Cl.
*G01T 1/24* (2006.01)
(52) U.S. Cl. .............................. 250/370.14; 250/370.06
(58) Field of Classification Search ........... 250/370.08, 250/370.09, 370.14, 370.07
See application file for complete search history.

(56) References Cited

U.S. PATENT DOCUMENTS

| | | | | |
|---|---|---|---|---|
| 4,318,750 A | * | 3/1982 | Rai-Choudhury et al. | 438/798 |
| 5,010,321 A | * | 4/1991 | Larner et al. | 340/600 |
| 5,742,058 A | * | 4/1998 | Pantigny et al. | 250/370.08 |
| 6,020,619 A | * | 2/2000 | Wada et al. | 257/428 |
| 6,072,224 A | * | 6/2000 | Tyson et al. | 257/443 |
| 6,201,248 B1 | * | 3/2001 | Marion et al. | 250/370.08 |
| 6,310,372 B1 | * | 10/2001 | Katayama et al. | 257/291 |
| 6,917,041 B2 | * | 7/2005 | Doty et al. | 250/370.09 |
| 2003/0214348 A1 | * | 11/2003 | Singh et al. | 327/552 |
| 2004/0142524 A1 | * | 7/2004 | Grupp et al. | 438/197 |
| 2004/0227094 A1 | * | 11/2004 | Tompa et al. | 250/370.01 |

\* cited by examiner

*Primary Examiner*—Albert Gagliardi
(74) *Attorney, Agent, or Firm*—Richard A. Henkler; Hoffman, Warnick & D'Alessandro LLC

(57) ABSTRACT

A radiation detector formed using silicon-on-insulator technology. The radiation detector includes a silicon layer formed on an insulating substrate, wherein the silicon layer includes a PNPN structure, and a gate layer formed over the PNPN structure, wherein the gate layer includes a PN gate. Latch-up occurs in the radiation detector only in response to incident radiation.

17 Claims, 4 Drawing Sheets

SILICON-ON-INSULATOR LATCH-UP PULSE-RADIATION DETECTOR

BACKGROUND OF INVENTION

1. Technical Field

The present invention relates generally to integrated circuits, and more particularly, to a latch-up pulse-radiation detector formed using silicon-on-insulator (SOI) technology.

2. Related Art

Silicon-on-insulator (SOI) technology, which is becoming of increasing importance in the field of integrated circuits, deals with the formation of semiconductor devices (e.g., diodes, transistors, etc.) in a relatively thin layer of semiconductor material overlaying a layer of insulating material. SOI technology offers many advantages over bulk complementary metal-oxide-semiconductor (CMOS) processes, including, for example, higher performance, higher packing density, lower power consumption, and a substantial reduction of latch-up.

The cause of latch-up exists in all junction-isolated or bulk CMOS processes: parasitic PNPN paths. The resultant parasitic PNP and NPN bipolar transistors formed by such parasitic PNPN paths, under normal conditions, cannot be activated. However, under some conditions, for example, in response to a spurious current spike, the parasitic PNP or NPN transistors may be activated, forming a circuit with large positive feedback, i.e., latch-up occurs.

Radiation detectors are often formed using bulk CMOS processes to take advantage of latch-up caused by parasitic PNPN bipolar transistors. In particular, bulk CMOS-type radiation detectors are designed to selectively enter a latch-up state in response to an interaction with an alpha particle, a cosmic ray, or other type of radiation that is capable of producing a sufficiently large current spike in the detector. Unfortunately, because one of the characteristics of SOI technology is the substantial reduction of latch-up, it has proven very difficult to produce an SOI radiation detector in which ionizing-radiation-triggered latch-up can occur. Such an SOI-type radiation detector would be desirable because of the many advantages provided by SOI technology over bulk CMOS processes.

A PNPN diode structure, formed using bulk CMOS processes, is commonly employed to produce a radiation detector. Unfortunately, the bulk CMOS structure relies on a current path beneath the device isolation which is absent in SOI technology, thus making this design unsuitable for use as a radiation detector.

The PNPN diode structure 10 shown in FIG. 1 comprises an insulating substrate 12, a silicon layer 14 formed on the insulating substrate 12, a gate oxide layer (e.g., silicon dioxide) 16 formed on the silicon layer 14, a gate layer 18 formed on the gate oxide layer 16, and a silicide strap 20 formed over the gate layer 18. The silicon layer 14 includes a heavily doped P+ region 22, a heavily doped N+ region 24, a lightly-doped N-well 26, and a lightly doped P-well 28. The gate layer 18 includes a heavily doped P+ region 30 and a heavily doped N+ region 32 tied together by the silicide strap 20. The interface 46 between the side 34 of the P+ region 30 and the side 36 of the N+ region 32 of the gate layer 18 is substantially coincident with the interface 48 between the side 38 of the N-well 26 and the side 40 of the P-well 28 of the silicon layer 14. The opposing side 42 of the P+ region 30 of the gate layer 18 extends partially over the P+ region 22 of the silicon layer 14. Similarly, the opposing side 44 of the N+ region 32 of the gate layer 18 extends partially over the N+ region 24 of the silicon layer 14. The PNPN diode structure 10 can be formed using conventional SOI processes known to those skilled in the art.

In operation, as shown in FIG. 2, the P+ region 22 of the silicon layer 14 is tied to a source voltage (e.g., VDD), the N+ region 24 of the silicon layer 14 is tied to ground (e.g., VSS), while the gate layer 18 is at some operational voltage. A parasitic PMOS FET 50 is formed in the silicon layer 14, with its source (Sp) formed by the P+ region 22, its body (Bp) formed by the N-well 26, its drain (Dp) formed by the P-well 28, and its gate (Gp) formed by the P+ region 30 of the gate layer 18. Similarly, a parasitic NMOS FET 52 is formed in the silicon layer 14, with its source (Sn) formed by the N+ region 24, its body (Bn) formed by the P-well 28, its drain (Dn) formed by the N-well 26, and its gate (Gn) formed by the N+ region 32 of the gate layer 18.

The threshold voltage (Vtp) of the parasitic PMOS FET 50 is typically on the order of about −0.2 volts. Therefore, to prevent the parasitic PMOS FET 50 from turning on, the P+ region 30 of the gate layer 18 (i.e., Gp) must be tied to a voltage substantially equal to the source voltage (VDD). Similarly, the threshold voltage (Vtn) of the parasitic NMOS FET 52 is typically on the order of about 0.2 volts. Therefore, to prevent the parasitic NMOS FET 52 from turning on, the N+ region 32 of the gate layer 18 (i.e., Gn) must be tied to a voltage substantially equal to VSS. Therefore, there are two contradictory requirements for the voltage on the gate layer 18: the gate layer 18 must be tied to VDD to prevent the parasitic PMOS FET 50 from turning on, while at the same time, the gate layer 18 must be tied to VSS to prevent the parasitic NMOS FET 52 from turning on. Since these requirements cannot both be met at the same time, one or the other of the parasitic FETs 50, 52, will always turn on in response to a minimal gate bias, and latch-up will be initiated.

Accordingly, there is a need in the art for a radiation detector formed using SOI technology.

SUMMARY OF INVENTION

The present invention provides a latch-up pulse-radiation detector formed using silicon-on-insulator (SOI) technology.

A first aspect of the present invention is directed to a silicon-on-insulator radiation detector, comprising a silicon layer formed on an insulating substrate, wherein the silicon layer includes a PNPN structure, a gate layer formed over the PNPN structure, wherein the gate layer includes a PN gate, and wherein latch-up occurs in the radiation detector only in response to incident radiation.

A second aspect of the present invention is directed to a radiation detector comprising a silicon-on-insulator PNPN diode structure, wherein latch-up occurs in the radiation detector only in response to incident radiation.

A third aspect of the present invention is directed to an integrated circuit comprising a silicon-on-insulator radiation detector, wherein the radiation detector includes a silicon layer formed on an insulating substrate, wherein the silicon layer includes a PNPN structure, a gate layer formed over the PNPN structure, wherein the gate layer includes a PN gate, and wherein latch-up occurs in the radiation detector only in response to incident radiation.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 3:
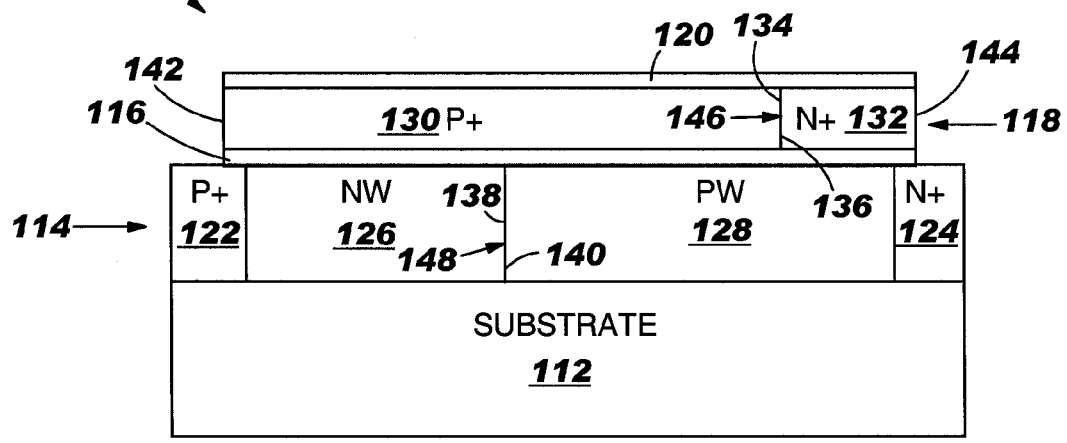
FIGS. 3 and 4 illustrate a radiation detector comprising a PNPN SOI diode structure in accordance with an embodiment of the present invention.

A first embodiment of an SOI radiation detector in accordance with the present invention, formed as a PNPN diode structure 100, is illustrated in FIG. 3. The PNPN diode structure 100 shown in FIG. 3 comprises an insulating substrate 112, a silicon layer 114 formed on the insulating substrate 112, a gate oxide layer 116 formed on the silicon layer 114, a gate layer 118 formed on the gate oxide layer 116, and a silicide strap 120 formed over the gate layer 118. The silicon layer 114 includes a heavily doped P+ region 122, a heavily doped N+ region 124, a lightly-doped N-well 126, and a lightly doped P-well 128. The gate layer 118 includes a heavily doped P+ region 130 and a heavily doped N+ region 132 tied together by the silicide strap 120. The PNPN diode structure 100 can be formed using conventional SOI processes known to those skilled in the art.

Figure 1:
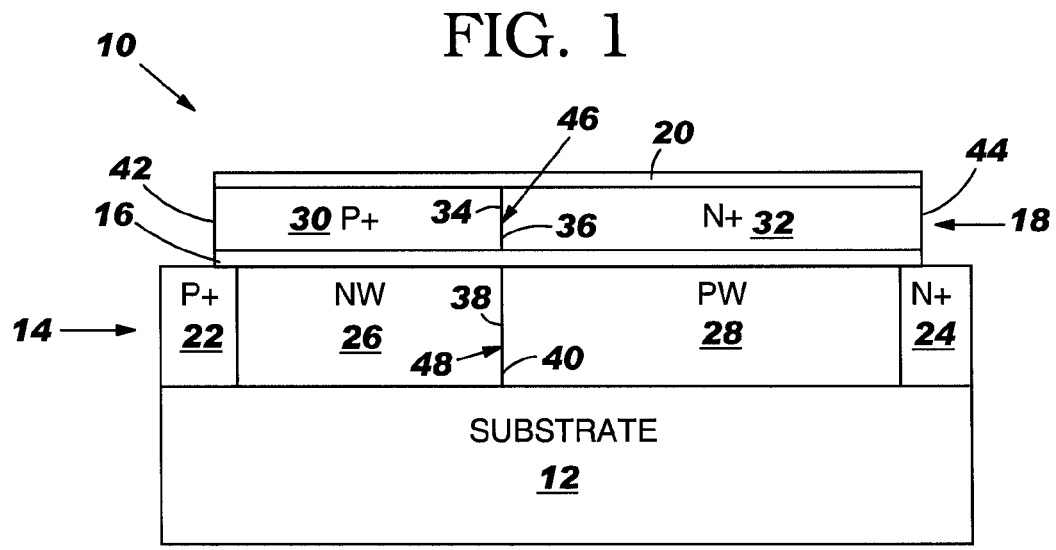
FIGS. 1 and 2 illustrate a four-layer SOI PNPN diode structure that suffers from immediate latch-up.

As detailed above, in the PNPN diode structure 10 shown in FIG. 1, the interface 46 between the P+ region 30 and the N+ region 32 of the gate layer 18 is substantially coincident with the interface 48 between the N-well 26 and the P-well 28 of the silicon layer 14. In the PNPN diode structure 100, however, the interface 146 between the side 134 of the P+ region 130 and the side 136 of the N+ region 132 of the gate layer 118 is offset relative to the interface 148 between the side 138 of the N-well 126 and the side 140 of the P-well 128 of the silicon layer 114. In particular, as shown in FIG. 3, the interface 146 between the P+ region 130 and the N+ region 132 of the gate layer 118 is located over the P-well 128 of the silicon layer 114. Thus, the P+ region 130 extends a substantial distance over the P-well 128 of the silicon layer 114. The opposing side 142 of the P+ region 130 of the gate layer 118 extends partially over the P+ region 122 of the silicon layer 114, while the opposing side 144 of the N+ region 132 of the gate layer 118 extends partially over the N+ region 124 of the silicon layer 114.

Figure 4:
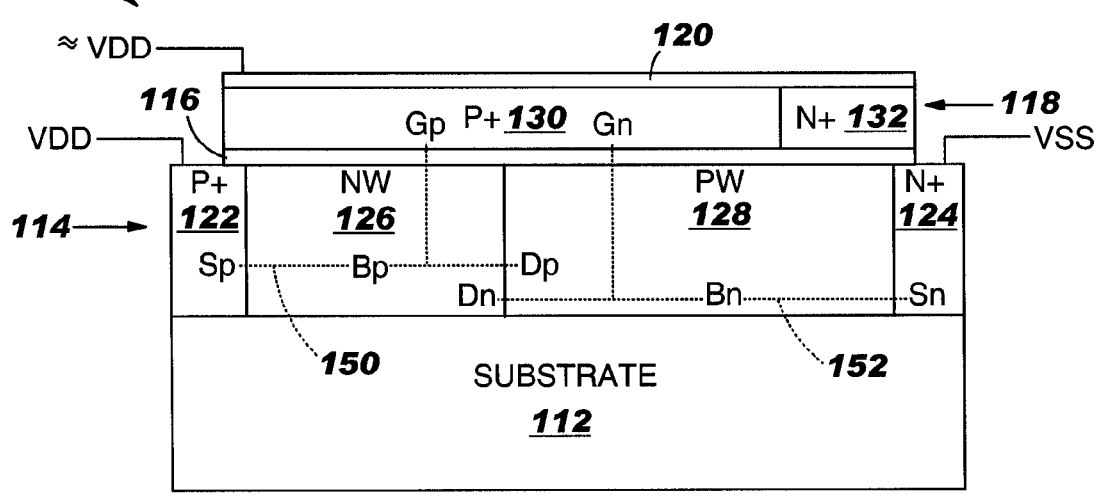

In operation, as shown in FIG. 4, the P+ region 122 of the silicon layer 114 is tied to a source voltage (e.g., VDD) and the N+ region 124 of the silicon layer 114 is tied to ground (e.g., VSS). A parasitic PMOS FET 150 is formed in the silicon layer 114, with its source (Sp) formed by the P+ region 122, body (Bp) formed by the N-well 126, drain (Dp) formed by the P-well 128, and gate (Gp) formed by the P+ region 130 of the gate layer 118. The parasitic PMOS FET 150 has a threshold voltage (Vtp) typically on the order of about −0.2 volts. In the present invention, to prevent the parasitic PMOS FET 150 from turning on, the P+ region 130 of the gate layer 118 is tied a voltage substantially equal to the source voltage (VDD).

A parasitic NMOS FET 152 is also formed in the silicon layer 114, with its source (Sn) formed by the N+ region 124, body (Bn) formed by the P-well 128, drain (Dn) formed by the N-well 126, and gate (Gn) formed by the P+ region 130 of the gate layer 118. Unlike the parasitic NMOS FET 52 described above with regard to FIG. 2, however, the threshold voltage (Vtn) of the parasitic NMOS FET 152 is not on the order of about 0.2 volts. Rather, because the P+ region 130 of the gate layer 118 extends a considerable distance over the P-well 128, and forms the gate of the parasitic NMOS FET 152, the threshold voltage (Vtn) of the parasitic NMOS FET 152 is increased by an amount approximately equal to the band-gap voltage of silicon, which is about 1.0 volts, to a value equal to about 1.2 volts. Now, as long as VDD is kept below 1.2 volts, the parasitic NMOS FET 152 will remain off due to its unusually high threshold voltage (Vtn) of about 1.2 volts.

The above-described PNPN diode structure 100 can be used as a radiation detector. In particular, in response to incident radiation, numerous electron-hole pairs are formed in both the N-well 126 and P-well 128 regions, where the lifetime of carriers tends to be very long. The electrons and holes generated in response to the incident radiation will drift and diffuse through the N and P-wells 126, 128. In particular, the electrons will drift and diffuse toward the P+ region 122, while the holes will drift and diffuse toward the N+ region 124. The holes act like a base current for the parasitic n-p-n bipolar transistor formed by the N-well 126, P-well 128, and N+ region 124, while the electrons act like a base current for the parasitic p-n-p transistor formed by the P-well 128, N-well 126, and P+ region 122. If the lifetimes of the electrons and holes are sufficiently long, gain will occur. That is, for each electron entering the P+ region 122 from the N-well 126, many holes will leave the P+ region 122 and enter the N-well 126. Similarly, for each hole entering the N+ region 124 from the P-well 128, many electrons will leave the N+ region 124 and enter the P-well 128. This process will continue, creating a runaway (i.e., latch-up) condition. The current flowing through the PNPN diode structure 100 will continue to increase until it reaches a maximum level determined by the parasitic resistances within the structure.

Figure 5:
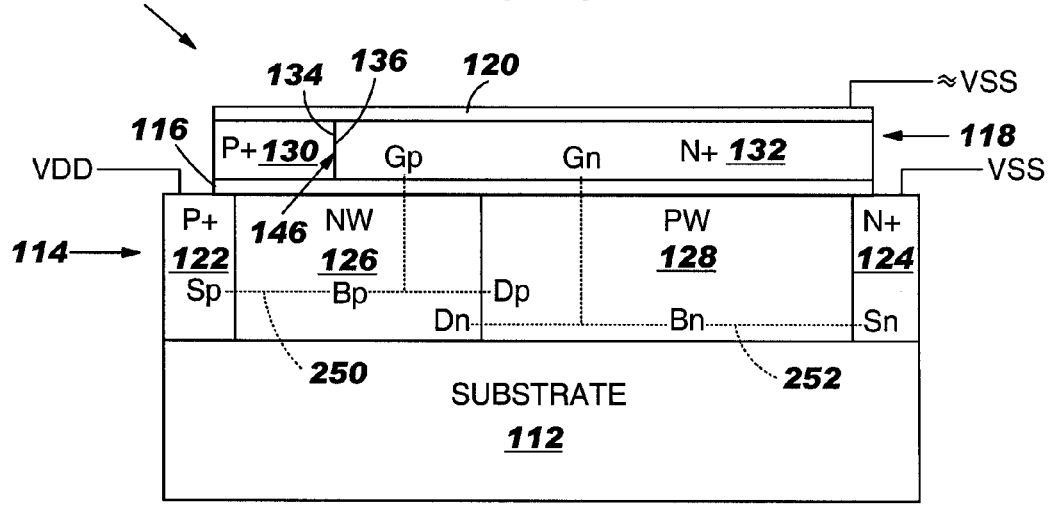
FIG. 5 illustrates a radiation detector comprising a PNPN SOI diode structure in accordance with another embodiment of the present invention.

A complementary version of a PNPN diode structure 200, which can also be used as a radiation detector, is illustrated in FIG. 5. In this embodiment of the present invention, the interface 146 between the side 134 of the P+ region 130 and the side 136 of the N+ region 132 of the gate layer 118 is located over the N-well 126 of the silicon layer 114. The P+ region 122 of the silicon layer 114 is tied to a source voltage (e.g., VDD) and the N+ region 124 of the silicon layer 114 is tied to ground (e.g., VSS). A parasitic NMOS FET 252 is formed in the silicon layer 114, with its source (Sn) formed by the N+ region 124, body (Bn) formed by the P-well 128, drain (Dn) formed by the N-well 126, and gate (Gn) formed by the N+ region 132 of the gate layer 118. The parasitic NMOS FET 252 has a threshold voltage (Vtn) typically on the order of about 0.2 volts. In the present invention, to prevent the parasitic NMOS FET 252 from turning on, the N+ region 132 of the gate layer 118 is tied a voltage substantially equal to VSS.

A parasitic PMOS FET 250 is also formed in the silicon layer 114, with its source (Sp) formed by the P+ region 122, body (Bp) formed by the N-well 126, drain (Dp) formed by the P-well 128, and gate (Gp) formed by the N+ region 132 of the gate layer 118. Because the N+ region 132 of the gate layer 118 extends a considerable distance over the N-well 126, and forms the gate of the parasitic PMOS FET 250, the threshold voltage (Vtp) of the parasitic PMOS FET 250 is increased by an amount approximately equal to the band-gap voltage of silicon to about −1.2 volts. Now, as long as VDD is kept below 1.2 volts, the parasitic PMOS FET 250 will remain off due to its unusually high threshold voltage (Vtp) of about −1.2 volts.

Figure 6:
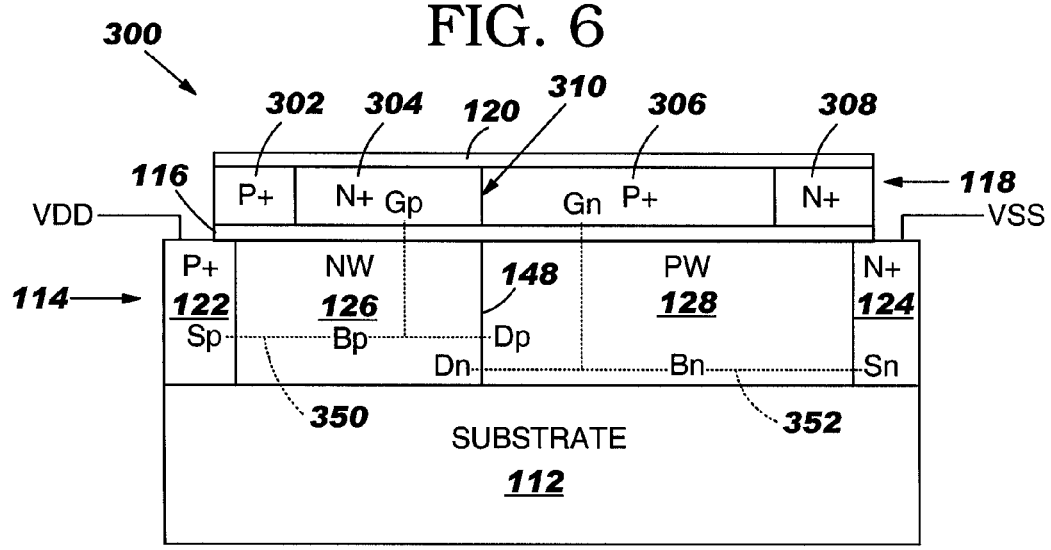
FIG. 6 illustrates a radiation detector comprising a PNPN SOI diode structure in accordance with yet another embodiment of the present invention.

Another embodiment of a radiation detector comprising a PNPN diode structure 300, which shares characteristics of both PNPN diode structures 100, 200, is illustrated in FIG. 6. In this embodiment, the gate layer 118 includes a first heavily doped P+ region 302, a first heavily doped N+ region 304 located over the N-well 126, a second heavily doped P+ region 306 located over the P-well 128, and a second heavily doped N+ region 308. The interface 310 between the first N+ region 304 and the second P+ region 306 of the gate layer 118 is located approximately coincident with the interface 148 between the N-well 126 and the P-well 128 of the silicon layer 114.

The P+ region 122 of the silicon layer 114 is tied to a source voltage (e.g., VDD) and the N+ region 124 of the silicon layer 114 is tied to ground (e.g., VSS). A parasitic PMOS FET 350 is formed in the silicon layer 114, with its source (Sp) formed by the P+ region 122, body (Bp) formed by the N-well 126, drain (Dp) formed by the P-well 128, and gate (Gp) formed by the first N+ region 304 of the gate layer 118. Because the first N+ region 304 of the gate layer 118 is located over the N-well 126, and forms the gate (Gp) of the parasitic PMOS FET 350, the threshold voltage (Vtp) of the parasitic PMOS FET 250 is approximately −1.2 volts. Similarly, a parasitic NMOS FET 352 is formed in the silicon layer 114, with its source (Sn) formed by the N+ region 124, body (Bn) formed by the P-well 128, drain (Dn) formed by the N-well 126, and gate (Gn) formed by the second P+ region 306 of the gate layer 118. The location of the second P+ region 306 over the P-well 128 results in the NMOS FET 352 having a threshold voltage (Vtn) on the order of about 1.2 volts. In this embodiment of the invention, the parasitic PMOS FET 350 will remain off as long as the gate voltage is kept more positive than (VDD −1.2 volts), while the parasitic NMOS FET 352 will remain off as long as the gate is kept less than 1.2 volts. Thus, the gate layer 118 may be tied to VDD, VSS or other suitable voltage between VDD and VSS, when VDD is less than 1.2 volts.

Figure 2:
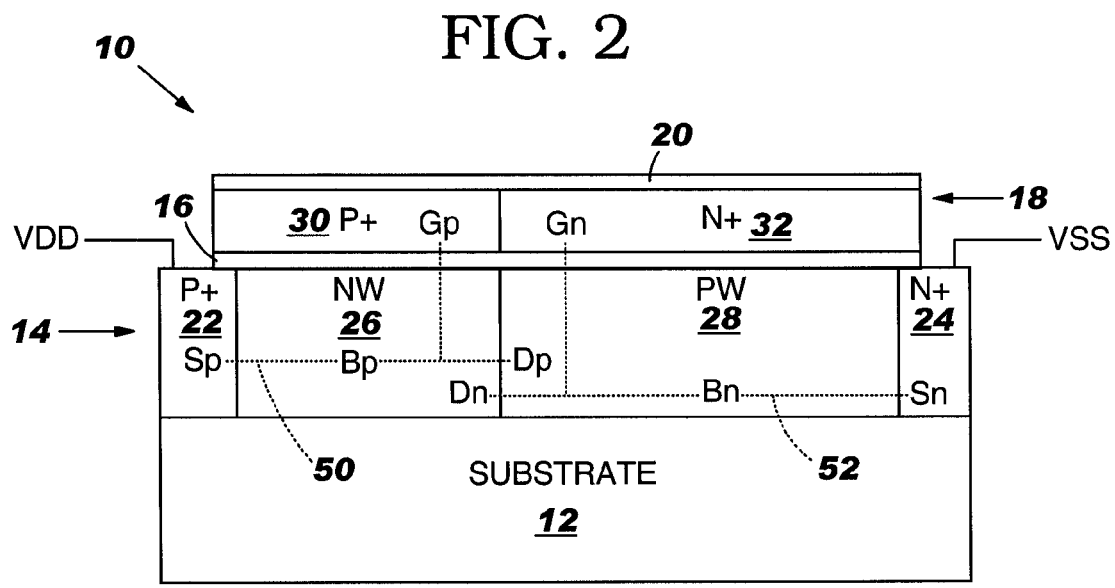

As detailed above with regard to FIG. 2, the N-well 126 and P-well 128 form the bases of parasitic p-n-p and n-p-n bipolar transistors. To prevent accidental latch-up caused, for example, by capacitive coupling, the floating bases (i.e., N-well 126 and P-well 128) can be clamped to VDD, VSS, respectively. One way of accomplishing this in the PNPN diode structure 100 is illustrated in FIG. 7.

Figure 7:
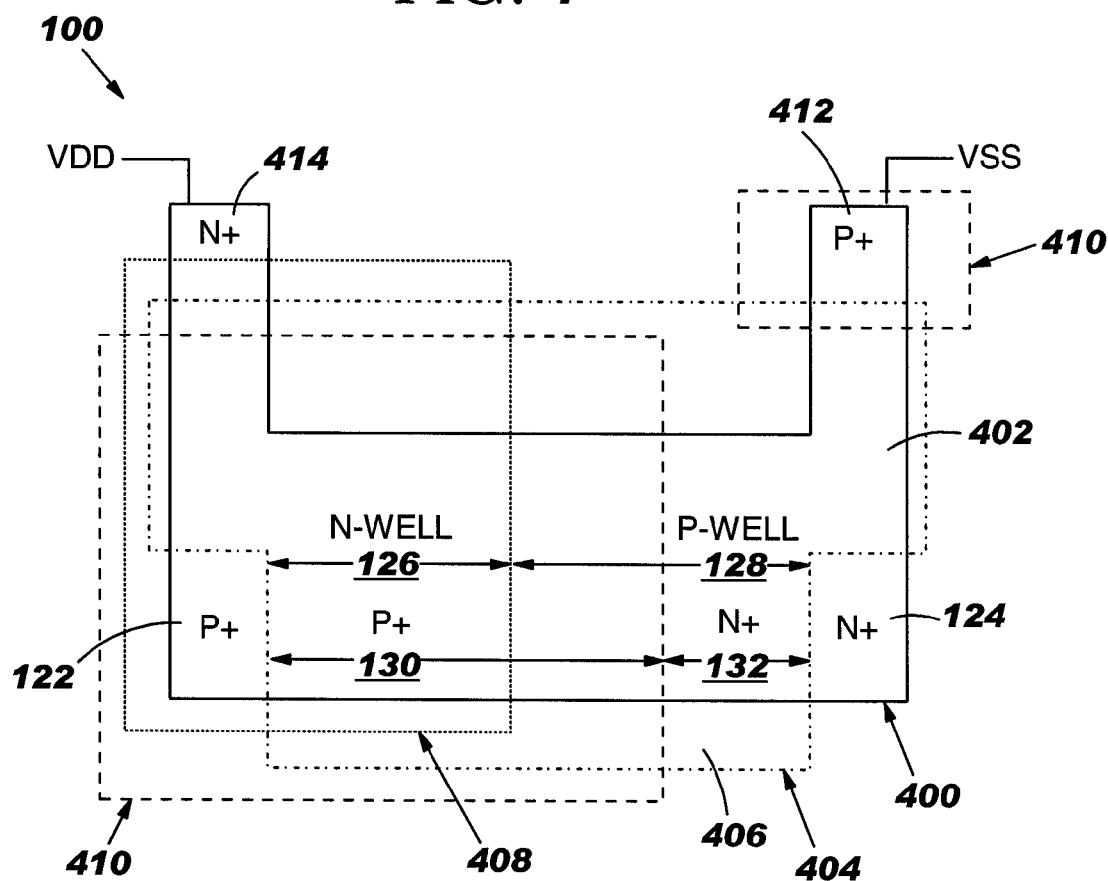
FIG. 7 illustrates a structure for forming a radiation detector comprising a PNPN SOI diode structure with clamped N and P-wells.

FIG. 7 summarizes a process for providing the PNPN structure 100 of FIG. 3 with clamped N-well 126 and P-well 128. Various processing steps known to one of ordinary skill in the art have been omitted for simplicity and clarity.

A mask 400 is provided to form a silicon island 402. Another mask 404 is used to form a gate electrode 406 (i.e., gate layer 118) over the silicon island 400. A gate dielectric (not shown) is located between the gate electrode 406 and the silicon island 402. The area of the silicon island 402 below the gate electrode 406, and covered by an N-well mask 408, forms the N-well 126 of the PNPN diode structure 100. The area of the silicon island 402 below the gate electrode 406, and not covered by the N-well mask 408, forms the P-well 128 of the PNPN diode structure 100. The areas of the silicon island 402 not covered by the gate electrode 406 are heavily doped either P+ or N+ via ion implantation. In particular, those areas of the silicon island 402 that are not covered by the gate electrode 406, but are covered by masks 410, are doped P+, while those areas of the silicon island that are not covered by the gate electrode 406 or the masks 410 are doped N+. This produces the N+ region 124 and P+ region 122 of the silicon layer 114. This also produces an n-p-n base contact 412 that is coupled to the P-well 128 and a p-n-p base contact 414 that is coupled to the N-well 126. The n-p-n base contact 412 and p-n-p base contact 414 are tied to VSS and VDD, respectively, to clamp the floating bases. The same doping process is used to dope the gate electrode 406 either P+ or N+, again in dependence upon the location of the masks 410, to form the P+ region 130 and N+ region 132 of the gate layer 118.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A silicon-on-insulator radiation detector, comprising:
    a silicon layer formed on an insulating substrate, wherein the silicon layer includes a PNPN structure; and
    a gate formed over the PNPN structure, wherein a PN interface of the gate is offset from a P-well-N-well interface of the PNPN structure;
    wherein latch-up occurs in the radiation detector only in response to incident radiation.

2. The silicon-on-insulator radiation detector of claim 1, wherein the PNPN structure comprises a P+ region, an N-well, a P-well, and an N+ region, and wherein the gate comprised a first P+ region and a first N+ region.

3. The silicon-on-insulator radiation detector of claim 2, wherein the first N+ region of the gate covers the P-well of the PNPN structure and extends a substantial distance over the N-well of the PNPN structure.

4. The silicon-on-insulator radiation detector of claim 3, further comprising:
    a parasitic NMOS FET within the radiation detector that is prevented from turning on by coupling the N+ region of the PNPN structure and the first N+ region of the gate to ground; and
    a parasitic PMOS FET within the radiation detector having a threshold voltage of about −1.2 volts, wherein the threshold voltage prevents the parasitic PMOS FET from turning on.

5. The silicon-on-insulator radiation detector of claim 2, wherein the first P+ region of the gate covers the N-well of the PNPN structure and extends a substantial distance over the P-well of the PNPN structure.

6. The silicon-on-insulator radiation detector of claim 5, further comprising:
    a parasitic PMOS FET within the radiation detector that is prevented from turning on by coupling the P+ region of the PNPN structure and the first P+ region of the gate to a source voltage; and
    a parasitic NMOS FET within the radiation detector having a threshold voltage of about 1.2 volts, wherein the threshold voltage prevents the parasitic NMOS FET from turning on.

7. The silicon-on-insulator radiation detector of claim 1, wherein the gate comprises a PNPN gate, and wherein the PNPN gate includes a first P+ region, a first N+ region, a second P+ region, and a second N+ region.

8. The silicon-on-insulator radiation detector of claim 7, wherein the first N+ region of the PNPN gate is located over the N-well of the PNPN structure and the second P+ region of the PNPN gate is located over the P-well of the PNPN structure.

9. The silicon-on-insulator radiation detector of claim 8, wherein an interface between the first N+ region and the second P+ region of the PNPN gate is substantially coincident with an interface between the P-well and N-well of the PNPN structure.

10. The silicon-on-insulator radiation detector of claim 8, further comprising:
   a parasitic PMOS FET within the radiation detector having a threshold voltage of about −1.2 volts, wherein the threshold voltage prevents the parasitic NMOS FET from turning on; and
   a parasitic NMOS FET within the radiation detector having a threshold voltage of about 1.2 volts, wherein the threshold voltage prevents the parasitic NMOS FET from turning on.

11. A radiation detector, comprising:
   a silicon-on-insulator PNPN diode structure and a gate formed over the PNPN diode structure, wherein a PN interface of the gate is off set from a P-well-N-well interface of the PNPN diode structure, wherein latch-up occurs in the radiation detector only in response to incident radiation.

12. The radiation detector of claim 11, wherein at least one parasitic FET within the radiation detector has a threshold voltage of about 1.2 volts or −1.2 volts.

13. The radiation detector of claim 11, further comprising:
   a PNPN gate over the PNPN diode structure, wherein at least one parasitic FET within the radiation detector has a threshold voltage of about 1.2 volts or −1.2 volts.

14. An integrated circuit, comprising:
   a silicon-on-insulator radiation detector, wherein the radiation detector includes:
   a silicon layer formed on an insulating substrate, wherein the silicon layer includes a PNPN structure;
   a gate formed over the PNPN structure wherein a PN interface of the gate is offset from a P-well-N-well interface of the PNPN structure; and
   wherein latch-up occurs in the radiation detector only in response to incident radiation.

15. The integrated circuit of claim 14, wherein the PNPN structure comprises a P+ region, an N-well, a P-well, and an N+ region, wherein the gate comprises a first P+ region and a first N+ region, and wherein the first P+ region of the gate covers the N-well of the PNPN structure and extends a substantial distance over the P-well of the PNPN structure.

16. The integrated circuit of claim 14, wherein the PNPN structure comprises a P+ region, an N-well, a P-well, and an N+ region, wherein the gate comprises a first P+ region and a first N+ region, and wherein the first N+ region of the gate covers the P-well of the PNPN structure and extends a substantial distance over the N-well of the PNPN structure.

17. A method for forming a silicon-on-insulator radiation detector, comprising;
   forming a silicon layer on an insulating substrate, wherein the silicon layer includes a PNPN structure; and
   forming a gate on the silicon layer and offsetting a PN interface of the gate from a P-well-N-well interface of the PNPN structure;
   wherein latch-up occurs in the radiation detector only in response to incident radiation.

* * * * *

UNITED STATES PATENT AND TRADEMARK OFFICE
CERTIFICATE OF CORRECTION

PATENT NO. : 6,995,376 B2  Page 1 of 1
DATED : February 7, 2006
INVENTOR(S) : Cottrell et al.

It is certified that error appears in the above-identified patent and that said Letters Patent is hereby corrected as shown below:

Column 6,
Line 17, delete "NMOS" and insert -- PMOS --.

Signed and Sealed this

Twenty-fifth Day of April, 2006

JON W. DUDAS
*Director of the United States Patent and Trademark Office*